(12) United States Patent
Kim

(10) Patent No.: US 6,876,074 B2
(45) Date of Patent: Apr. 5, 2005

(54) STACK PACKAGE USING FLEXIBLE DOUBLE WIRING SUBSTRATE

(75) Inventor: Shin Kim, Cheonan (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/201,805

(22) Filed: Jul. 23, 2002

(65) Prior Publication Data

US 2003/0067064 A1 Apr. 10, 2003

(30) Foreign Application Priority Data

Oct. 10, 2001 (KR) .......................... 2001-62435

(51) Int. Cl.[7] .................. H01L 23/02; H01L 23/34; H01L 23/48
(52) U.S. Cl. .................. 257/686; 257/723; 257/777
(58) Field of Search .................. 257/685, 686, 257/688, 690, 723, 734, 777; 438/107, 109, 110, 117, 612, 617, 666

(56) References Cited

U.S. PATENT DOCUMENTS 5,714,405 A * 2/1998 Tsubosaki et al. .......... 438/118
5,793,870 A   8/1998 Conley .......................... 380/54
6,218,731 B1 * 4/2001 Huang et al. ............... 257/738
6,376,769 B1 * 4/2002 Chung ........................ 174/52.2

FOREIGN PATENT DOCUMENTS

| JP | 10-144851      | 5/1998  |
| JP | 10-242379      | 9/1998  |
| KR | 1020000025382  | 5/2000  |
| KR | 2001-0075955   | 11/2001 |

* cited by examiner

Primary Examiner—Hung Vu
(74) Attorney, Agent, or Firm—Harness, Dickey & Pierce, PLC

(57) ABSTRACT

A Chip Scale Package (CSP) type unit package including a semiconductor chip and a double wiring substrate, the double wiring substrate including an adhesive and a flexible tape having an upper surface with a first wiring pattern, a lower surface with a second wiring pattern and a plurality of vias electrically connecting portions of the first and second wiring patterns. Additionally, the unit package may be stacked on a conventional base package or on another unit package, where stacked packages are electrically interconnected.

13 Claims, 4 Drawing Sheets

STACK PACKAGE USING FLEXIBLE DOUBLE WIRING SUBSTRATE

BACKGROUND OF THE INVENTION

1. Field of the Invention

The present invention relates to semiconductor packaging technology, and more particularly to a stack package using a flexible double wiring substrate.

2. Description of the Related Art

It has been long desired to provide low-cost semiconductor chip packages that are lighter, smaller, faster and multi-functional, having improved reliability. In order to satisfy this goal, a package assembly technique has been developed, utilizing a recently introduced Ball Grid Array (BGA) package. Compared to the conventional plastic package, the BGA package reduces the mounting area on a motherboard and has improved electrical properties.

The BGA package uses a printed circuit board instead of a conventional plastic package lead frame. The surface of the printed circuit board that is opposite to the surface with a semiconductor chip attached thereto, contains an area for forming solder balls. Thus, the BGA package improves the mounting density on the motherboard but is limited by the size of the printed circuit board. That is, since the printed circuit board requires a predetermined area free of circuit wiring for mounting the semiconductor chip, the printed circuit board has a greater size than that of the semiconductor chip. Under these circumstances, a Chip Scale Package (CSP) has been introduced.

Several manufacturers in the U.S., JAPAN and Korea have recently developed various types of the CSP. One leading type of the CSPs is a BGA package using a tape circuit board comprising a flexible polyimide tape with circuit patterns formed on the polyimide tape. Usually, electrical connections attaching the semiconductor chip and the tape circuit board employ a beam lead bonding method or a wire bonding method.

FIG. 1 is a cross-sectional view of a CSP 100 using a wire bonding method. With reference to FIG. 1, the CSP 100 comprises a tape circuit board 20 with a window 22 at the center, and a semiconductor chip 10 that is attached to a bottom surface of tape circuit board 20. Semiconductor chip 10 is electrically connected to tape circuit board 20 by bonding electrode pads 12 to wiring pattern 23 with bonding wires 40 through window 22. Bonding wires 40 and the outer surface of semiconductor chip 10 exposed through window 22 and around the peripheral surface are encapsulated by a liquid encapsulant to form resin molding portions 50 and 53. Connection terminals 60 such as solder balls are formed on portions of wiring patterns 23 exposed from connection holes 28 on the upper surface of tape circuit board 20.

Tape circuit board 20 comprises a polyimide tape 21 with window 22 and wiring patterns 23 formed on the upper surface of polyimide tape 21. Wiring patterns 23 are around window 22 and include substrate pads 24, which are connected to corresponding electrode pads 12, and connection pads 26, to which the connection terminals 60 are attached. The upper surface of polyimide tape 21 not covered by connection pads 26 is coated with a protection layer 25 made, for example, of Photo Solder Resist (PSR). An elastomer 27 is formed on the lower surface of polyimide tape 21.

In addition to the CSP, other techniques are developed so as to reduce the size of the package, for example, a stack packaging technique for three-dimensionally stacking a plurality of semiconductor chips or a plurality of packages. A package implemented by this technique is usually referred to as a stack package.

Since a stack package using the conventional semiconductor packages employs packages that have already passed reliability tests, the stack package has a low failure rate but is comparatively thick. On the other hand, a stack package stacking semiconductor chips, (referred to as a "stack chip package"), is much thinner. The stack chip package, however, employs chips that were not previously inspected in reliability tests, thereby increasing failure rates.

Therefore, if a stack package is manufactured by stacking the above-described CSPs, it would be desirable for stack package to have both advantages: thinness and reliability. However, it is not easy to stack the CSPs, each of which is mounted on the printed circuit board. That is, since the conventional CSP contains only solder bumps formed on the upper surface of the tape circuit board for external connection terminals, it is difficult to three-dimensionally stack the conventional CSPs.

SUMMARY OF THE INVENTION

Accordingly, it is desirable to be able to provide a stackable package and stacked packages using CSPs and flexible double wiring substrates.

It is further desirable to provide a stack package manufactured by the conventional CSP manufacturing process using the tape circuit board.

In order to achieve the foregoing and other features, the present invention provides a stack package formed by three-dimensionally stacking unit packages comprising a base package with a plurality of connection terminals; and a plurality of unit packages stacked on the base package, the unit packages comprising a first unit package having a first surface attached to the connection terminals of the base package and a second surface with first connection terminals electrically connected to the connection terminals of the base package, and a second unit package having a first surface attached to the first connection terminals and a second surface with second connection terminals electrically connected to the first connection terminals.

In some embodiments, a unit package includes a semiconductor chip having an active surface and a double wiring substrate, the double wiring substrate comprising (1) a flexible tape having: (1a) an upper surface with a first electrically conductive layer affixed thereon, the first electrically conductive layer defining a first wiring pattern; (1b) a lower surface with a second electrically conductive layer affixed thereon, the second electrically conductive layer defining a second wiring pattern; and (1c) a plurality of vias electrically connecting portions of the upper wiring pattern to portions of the lower wiring pattern; and (2) an adhesive film having a first side affixed to the second electrically conductive layer and a second side with at least a portion thereof affixed to the active surface of the semiconductor chip.

In some embodiments, a stack package includes (1) a unit package and (2) a base package, (3) wherein the unit package and base package are electrically connected. That is, a stack package includes (1) a unit package comprising a semiconductor chip; and a double wiring substrate comprising: (1a) a flexible tape having a first wiring pattern; a second wiring pattern; and a plurality of vias electrically connecting portions of the upper and lower wiring patterns; openings to expose portions of said first and second wiring pattern; and (1b) an adhesive film; (1c) wherein a portion of the flexible tape extends around an edge of and to a bottom surface of said semiconductor chip; and (2) a base package comprising: a base semiconductor chip; and a single wiring substrate, (3) wherein the unit package and base package are electrically connected.

In some embodiments, a stack package includes a unit package stacked on another unit package wherein the unit packages are electrically connected.

These and other embodiments are further discussed below with respect to the following figures.

BRIEF DESCRIPTION OF THE FIGURES

These and other features and advantages of the present invention will be readily understood with reference to the following detailed description thereof provided in conjunction with the accompanying drawings.

FIG. 3 is a cross-sectional view of the double wiring substrate with a semiconductor chip attached thereto.

FIG. 4 is a cross-sectional view of a unit package for the stack package, with the double wiring substrate wrapped around an edge and onto a bottom surface of a semiconductor chip.

FIG. 5 is a cross-sectional view of the first unit package with first connection terminals.

FIG. 6 is a cross-sectional view showing a stack structure of the second unit package on the first unit package interposing the first connection terminals therebetween.

FIG. 7 is a cross-sectional view showing a finished stack structure of the first and second unit package on a base package using connection terminals of the base package.

In the present disclosure, like objects that appear in more than one figure are provided with like reference numerals.

DETAILED DESCRIPTION OF THE PREFERRED EMBODIMENTS

Preferred embodiments of the present invention will be described below with reference to the accompanying drawings.

Figure 1:
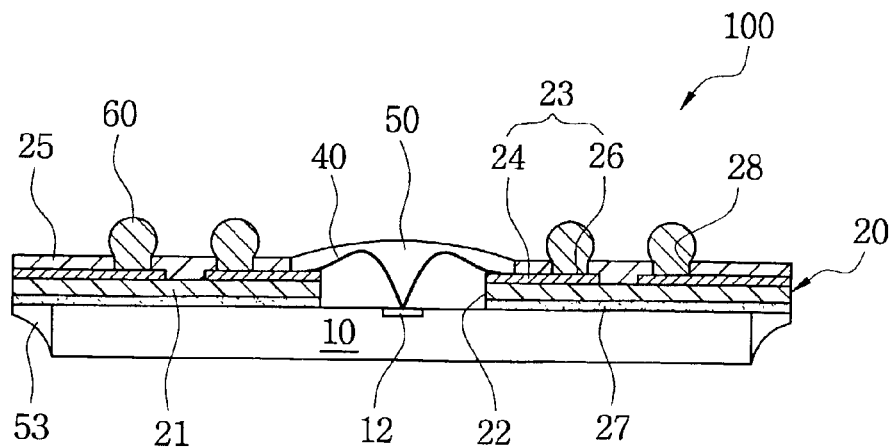
FIG. 1 is a cross-sectional view of a μ-BGA package, i.e., the conventional chip scale package (CSP) including a tape circuit board.
Figure 2:
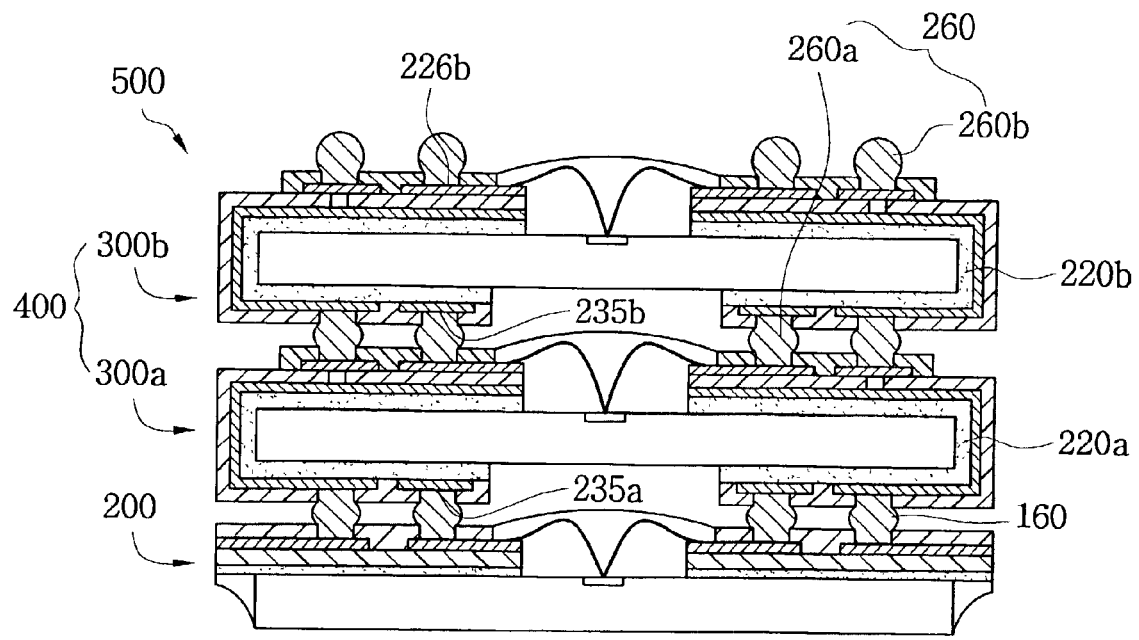
FIG. 2 is a cross-sectional view of a stack package using a flexible double wiring substrate in accordance with an embodiment of the present invention.

FIG. 2 is a cross-sectional view of a stack package 500 using a flexible double wiring substrates 220a and 220b in accordance with an embodiment of the present invention. With reference to FIG. 2, stack package 500 has a stack structure by three-dimensionally stacking stacked unit package 400 embodied by the present invention on the CSP 100 of FIG. 1. (CSP 100 is hereinafter referred to as "base package 200".) Stacked unit package 400 consists of a plurality of single unit packages 300, such as, a first unit package 300a and a second unit package 300b. First unit package 300a comprises a bottom surface attached to connection terminals 160 of base package 200 and a top surface with first connection terminals 260a electrically connected to connection terminals 160 of base package 200. Second unit package 300b comprises a bottom surface attached to first connection terminals 260a of first unit package 300a and a top surface with second connection terminals 260b electrically connected to first connection terminals 260a. Second connection terminals 260b of second unit package 300b serve as external connection terminals. First unit package 300a and second unit package 300b are each a CSP.

Base package 200 has the same configuration as that of the CSP 100 of FIG. 1 and its detailed description is herein omitted.

In order to discriminate the tape circuit board of base package 200 and the tape circuit board of single unit package 300, hereinafter, the tape circuit board of base package 200 having a single wiring pattern is referred to as a "single wiring substrate" and the tape circuit board of single unit package 300 having two-layered wiring patterns is referred to as a "double wiring substrate."

Figure 3:
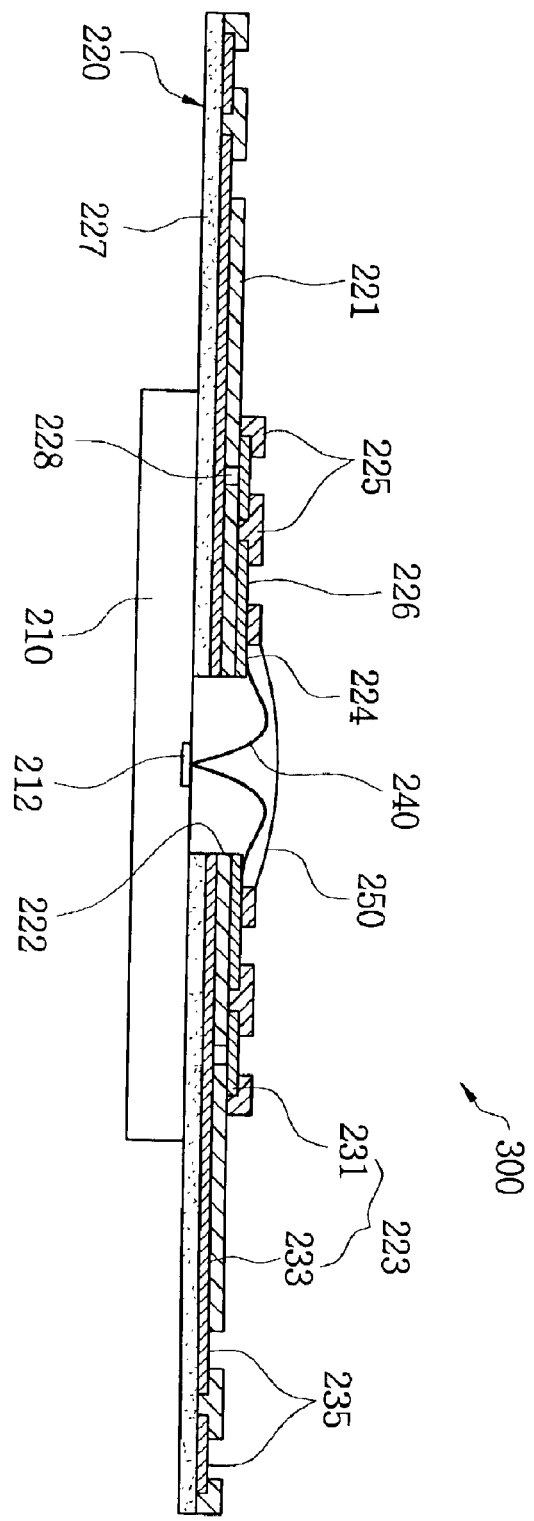
FIGS. 3 through 7 illustrate a manufacturing process of the stack package of FIG. 2 in accordance with an embodiment of the present invention.
Figure 4:
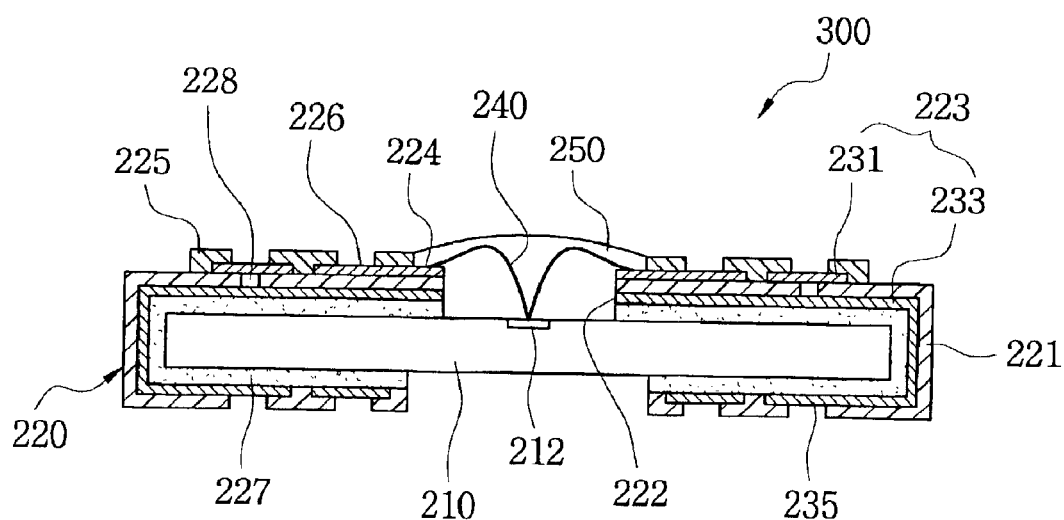

With reference to FIG. 3, in single unit package 300, a semiconductor chip 210 has a plurality of electrode pads 212 at the center of the active surface. As shown in FIG. 4, a double wiring substrate 220 is attached to semiconductor chip 210 so as to surround the outer surface of semiconductor chip 210 and comprises a window 222 for exposing electrode pads 212. Electrode pads 212 are electrically connected to double wiring substrate 220 by bonding wires 240. Electrode pads 212 and bonding wires 240 are encapsulated with a liquid encapsulant to form a resin molding portion 250. Connection terminals (260 in FIG. 5) are formed on a portion of double wiring substrate 220 above the active surface of semiconductor chip 210. Connection terminals 260 are situated so as to align with stack pads 235 of a higher unit package (not shown). Connection terminals 260 provide electrical connections to semiconductor chip 210 and to connection terminals of lower unit packages (not shown) or a base package (not shown). Stack pads 235 are formed on a portion of double wiring substrate 220 on the bottom surface of semiconductor chip 210 corresponding to connect terminals of a base package (200 of FIG. 2) or a second unit package (300b of FIG. 2).

Double wiring substrate 220 is a tape circuit board having a flexible polyimide tape 221 and wiring patterns 223 formed on both surfaces of polyimide tape 221. Window 222 corresponding to electrode pads 212 is formed on polyimide tape 221. Wiring patterns 223 include upper wiring pattern 231 on the top surface of polyimide tape 221 and lower wiring pattern 233 on the bottom surface of polyimide tape 221. Wiring patterns 223 further include an adhesive film 227, which is attached to lower wiring pattern 233. Adhesive film 227 serves to attach polyimide tape 221 with wiring patterns 223 to the outer surface of semiconductor chip 210. Adhesive film 227 may be an elastomer.

Upper wiring pattern 231 are around window 222 and include substrate pads 224, which are connected to corresponding electrode pads 212 by bonding wires 240, and connection pads 226, to which connection terminals (260 of FIG. 5) are attached. In order to prevent the oxidation of exposed upper wiring pattern 231, the upper wiring pattern 231, except for the above substrate pads 224 and connection pads 226, is coated with a protection layer 225. Photo Solder Resist (PSR) can be used as protection layer 225. In order to prevent the oxidation and to improve the bondability, substrate pads 224 and connection pads 226 are coated by a plating layer (not shown). The plating layer may be made of a metal such as Ni or Au.

Lower wiring pattern 233 comprises stack pads 235 corresponding to connection pads 226 of upper wiring pattern 231. Polyimide tape 221 above stack pads 235 is removed to expose stack pads 235. By forming connection pads 226 and stack pads 235 on the upper and lower sides of semiconductor chip 210 on the corresponding position, stack pads 235 of the upper unit package can be effectively aligned and stacked on connection terminals 260 of a lower unit package. Exposed stack pads 235 are also protected by the plating layer. Upper wiring pattern 231 is electrically connected to lower wiring pattern 233 by vias 228 perforating polyimide tape 221. Vias 228 are formed on overlapping portion of upper wiring pattern 231 and lower wiring pattern 233.

A manufacturing process of a configured stack package as shown in FIG. 2 will be described with reference to FIGS. 3 to 7. The process starts with preparing the base package and the unit package. Herein, since the base package is prepared by the conventional SCP manufacturing method, its process is omitted.

As shown in FIG. 3, double wiring substrate 220 is attached to the active surface of semiconductor chip 210. That is, double wiring substrate 220 is attached to the active surface of semiconductor chip 210 so as to expose electrode pads 212 of semiconductor chip 210 through window 222 of double wiring substrate 220.

Double wiring substrate 220 includes polyimide tape 221 and wiring patterns 223 having upper wiring pattern 231 and lower wiring pattern 233. Wiring patterns 223 are formed, for example, by stacking Cu or Au foil on the upper and lower surfaces of polyimide tape 221 and etching the foil by photolithography. Upper wiring pattern 231 comprise substrate pads 224 and connection pads 226 formed on the upper surface of polyimide tape 221 above the active surface of semiconductor chip 210. Upper wiring pattern 231, except for the above substrate pads 224 and connection pads 226, is coated with protection layer 225. Lower wiring pattern 233 comprises stack pads 235 formed on the lower surface of polyimide tape 221. Stack patterns 235 are formed outside of upper wiring pattern 231. Polyimide tape 221 on stack pads 235 are removed to expose stack pads 235 on the outside. Upper wiring pattern 231 is electrically connected to lower wiring pattern 233 by vias 228 perforating polyimide tape 221.

Window 222 is formed on the center of polyimide tape 221 and has a dimension large enough to expose electrode pads 212 on the active surface of semiconductor chip 210. Herein, wiring patterns 223 are formed, for example, by attaching the Cu or Au foil with a thickness of about 18 μm to 35 μm on both surfaces of polyimide tape 221 with a thickness of about 75 μm. Protection layer 225 is formed on the upper surface of polyimide tape 221 by screen-printing PSR with a viscosity of about 220 dpa.

Adhesive film 227 is formed on the lower surface of double wiring substrate 220. Adhesive film 227 may be an elastomer.

Progressing from FIG. 3 to FIG. 4, flexible double wiring substrate 220 is folded and attached to the outer surface of semiconductor chip 210 to form single unit package 300. A portion of double wiring substrate 220 outside of semiconductor chip 210 is folded around and attached to the lower surface of semiconductor chip 210. Stack pads 235 of double wiring substrate 220 serve as connection terminals for stacking single unit packages 300 and base package 200. Therefore, stack pads 235 below semiconductor chip 210 correspond to connection pads 224 on the active surface of semiconductor chip 210.

Figure 5:
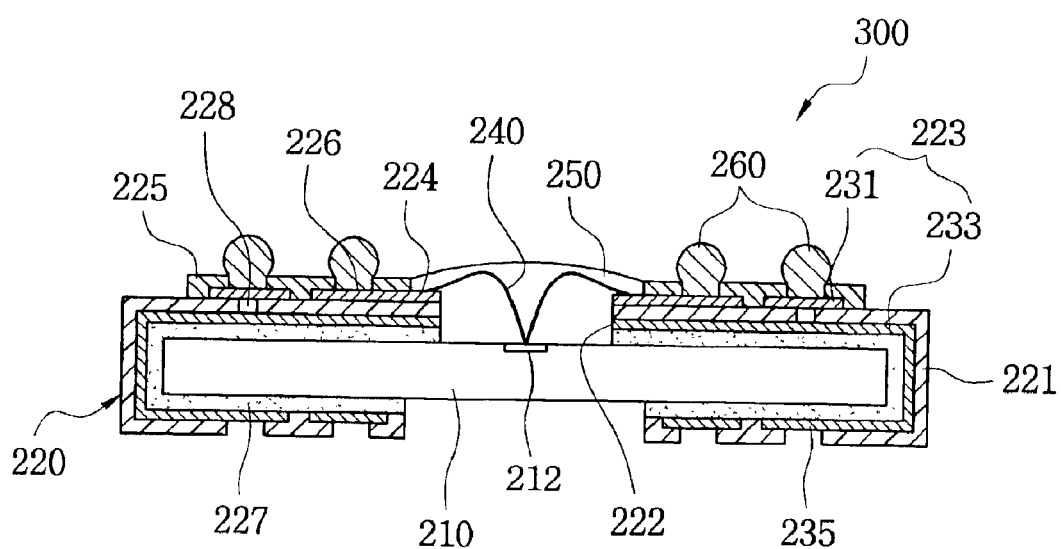

As shown in FIG. 5, connection terminals 260 are formed on connection pads 226 and usually use solder balls. Connection terminals 260 are used as interconnection means among single unit packages 300 and base package 200 or as an external connection means.

Figure 6:
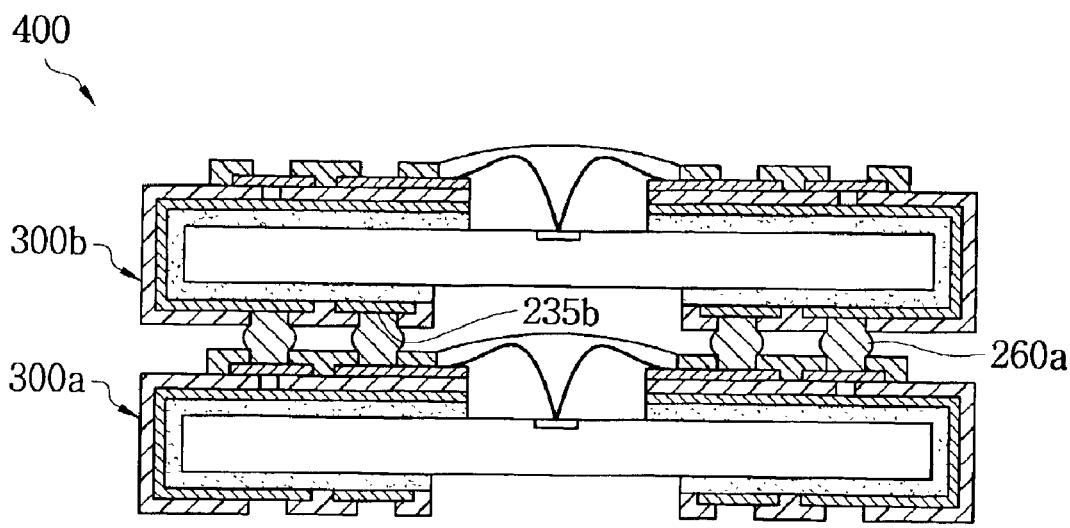

As shown in FIG. 6, first unit package 300a and second unit package 300b are stacked to form stacked unit package 400 by intermediating connection terminals 260a. That is, second unit package 300b is stacked on first unit package 300a by aligning and attaching stack pads 235b of second unit package 300b and connection terminals 260a of first unit package 300a. Herein, connection terminals 260a serve as the interconnection means between first unit package 300a and second unit package 300b.

Figure 7:
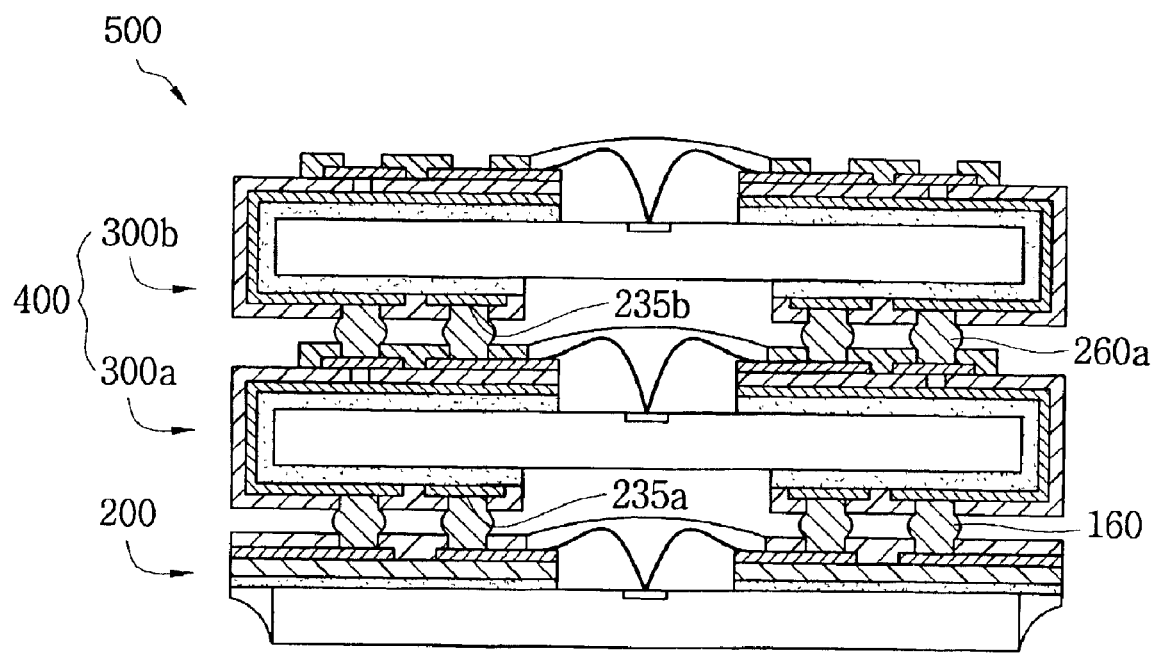

As shown in FIG. 7, the already-stacked first unit package 300a and second unit package 300b (forming stacked unit package 400) are stacked on base package 200 by intermediating connection terminals 160 of base package 400. Connection terminals 160 of base package 200 serve as interconnection means between stacked unit package 300 and base package 200. Although this embodiment of the present invention uses the conventional CSP as shown in FIG. 1 as base package 200, single unit package 300 according to the present invention may be used as base package 200.

Then, as shown in FIG. 2, the stack package 500 is completed by forming second connection terminals 260b on connection pads 226b of second unit package 300b. Solder balls can be used as second connection terminals 260b.

Furthermore, a third and/or a fourth unit package may be stacked on second unit package 300b.

Although the present invention discloses the stack package by three-dimensionally stacking the already-stacked stacked unit package 400 (comprised of first unit package 300a and second unit package 300b) on the base package 200, the first unit package 300a and the second unit package 300b may be stacked in order on the base package 200. In this case, the manufacturing process of stack package 500 comprises the steps of stacking first unit package 300a on base package 200 by intermediating connection terminals 160 of base package 200, stacking second unit package 300b on first unit package 300a by intermediating first connection terminals 260a and forming second connection terminals 260b on second package 300b. Again, a third and/or a fourth unit package may be stacked on second unit package 300b.

According to the present invention, a stack package is manufactured by three-dimensionally stacking a plurality of single unit packages 300 on a CSP-type base package 200.

Since the stack package is manufactured by the conventional packaging process, except for a step of folding up the double wiring substrate, the present invention minimizes additional cost, thereby reducing the production cost.

Furthermore, CSP-type unit packages are stacked on a CSP-type base package, thereby allowing the stack structure to be thinner compared to the conventional stack package.

Single unit packages 300a and 300b and base package 200 can be individually inspected with reliability tests. Therefore, only good products that passed reliability testing are used in manufacturing stacked unit package 400 and stack package 500, thus reducing the failure rate of the stack package 500.

Although the preferred embodiments of the present invention have been described in detail hereinabove, it should be understood that many variations and/or modifications of the basic inventive concepts herein taught, which may appear to those skilled in the art, will still fall within the spirit and scope of the present invention as defined in the claims.

What is claimed is:

1. A unit package comprising:
a semiconductor chip having an active surface; and
a double wiring substrate, the double wiring substrate including,
 a flexible tape having,
  an upper surface with a first electrically conductive layer affixed thereon, said first electrically conductive layer defining a first wiring pattern;
  a lower surface with a second electrically conductive layer affixed thereon, said second electrically conductive layer defining a second wiring pattern;
  a plurality of vias electrically connecting portions of said first wiring pattern to portions of said second wiring pattern; and
 an adhesive film having a first side affixed to said second electrically conductive layer and a second side with at least a portion thereof affixed to said active surface of said semiconductor chip; and
the double wiring substrate defining a window exposing a portion of the active surface through which a plurality of bonding wires electrically connect the active surface to the first wiring pattern;
wherein a portion of said flexible tape extends around an edge of and to a bottom surface of said semiconductor chip with said adhesive film.

2. The unit package of claim 1, wherein:
said active surface of said semiconductor chip includes a plurality of electrode pads exposed in the window;
said flexible tape includes openings to expose portions of said first wiring pattern, defining a plurality of substrate pads; and
each of said bonding wires has a first end connected to an associated one of said electrode pads, and a second end connected to an associated one of said substrate pads of said first wiring pattern.

3. The unit package of claim 1, further comprising resin molding material filling said window and extending from said active surface of said semiconductor chip to above said bonding wires.

4. The unit package of claim 1, wherein said flexible tape includes openings to expose portions of said first wiring pattern, defining a plurality of connection pads.

5. The unit package of claim 4, further comprising:
a plurality of connection terminals on said exposed portion of said active surface, each of said plurality of connection terminals electrically connected to one of said plurality of connection pads by said bonding wires.

6. The unit package of claim 4, wherein said flexible tape includes openings to expose portions of said second wiring pattern, defining a plurality of stack pads.

7. The unit package of claim 6, wherein each of said plurality of connection pads and each of said plurality of stack pads have a plating layer.

8. The unit package of claim 1, wherein said flexible tape is a flexible polyimide tape.

9. The unit package of claim 1, wherein said adhesive film is an elastomer.

10. A stack package comprising:
a unit package comprising:
 a semiconductor chip having an active surface; and
 a double wiring substrate, the double wiring substrate including,
  a flexible tape having,
   an upper surface with a first electrically conductive layer affixed thereon, said first electrically conductive layer defining a first wiring pattern;
   a lower surface with a second electrically conductive layer affixed thereon, said second electrically conductive layer defining a second wiring pattern; and
   a plurality of vias electrically connecting portions of said first wiring pattern to portions of said second wiring pattern;
   openings to expose portions of said first wiring pattern, defining a plurality of connection pads;
   openings to expose portions of said second wiring pattern, defining a plurality of stack pads; and
  an adhesive film having a first side affixed to said second electrically conductive layer and a second side with at least a portion thereof affixed to said active surface of said semiconductor chip;
 the double wiring substrate defining a window exposing a portion of said active surface;
 wherein a portion of said flexible tape extends around an edge of and to a bottom surface of said semiconductor chip with said adhesive film attaching said flexible tape to said edge and bottom surface of said semiconductor chip; and
 a plurality of connection terminals formed on the exposed portion of said active surface, each of said plurality, of connection terminals electrically connected to one of said plurality of connection pads via bonding wires; and
a base package including a base semiconductor chip having an active base surface; and
 a single wiring substrate, the single wire substrate including,
  a base tape having,
  a surface with an electrically conductive base layer affixed thereon, said electrically conductive base layer defining a base wiring pattern;
  a base adhesive film having a first side affixed to said base tape and a second side affixed to said active base surface of said base semiconductor chip;
  openings to expose portions of said base wiring pattern, defining a plurality of base connection pads;
wherein a set of said plurality of base connection pads of said base package are each electrically connected to an associated one of said plurality of stack pads of said unit package.

11. A stack package comprising:
a plurality of unit packages wherein each of said unit packages comprising:
 a semiconductor chip having an active surface; and
 a double wiring substrate comprising:
 a flexible tape having,
  an upper surface with a first electrically conductive layer affixed thereon, said first electrically conductive layer defining a first wiring pattern;
  a lower surface with a second electrically conductive layer affixed thereon, said second electrically conductive layer defining a second wiring pattern; and
  a plurality of vias electrically connecting portions of said first wiring pattern to portions of said second wiring pattern;
  openings to expose portions of said first wiring pattern, defining a plurality of connection pads;
  openings to expose portions of said second wiring pattern, defining a plurality of stack pads; and
 an adhesive film having a first side affixed to said second electrically conductive layer and a second side with at least a portion thereof affixed to said active surface of said semiconductor chip;

wherein a portion of said flexible tape extends around an edge of and to a bottom surface of said semiconductor chip with said adhesive film attaching said flexible tape to said edge and bottom surface of said semiconductor chip; and wherein each of said unit packages stack defining neighboring unit packages, said neighboring unit packages defining an upper unit package and a lower unit package; wherein the double wiring substrate defines a window exposing a plurality of connection terminals on said active surface, the plurality of connection terminals are electrically connected to an associated one of said connection pads of said lower unit package via bonding wires in the window; and said plurality of stack pads of said upper unit package are electrically connected to an associated one of said connection pads of said lower unit package.

12. The stack package of claim 11, further comprising a base package comprising:
  a base semiconductor chip having an active base surface; and
  a single wiring substrate comprising:
  a base tape having,
    a surface with an electrically conductive base layer affixed thereon, said electrically conductive base layer defining a base wiring pattern;
    a base adhesive film having a first side affixed to said base tape and a second side affixed to said active base surface of said base semiconductor chip;
    openings to expose portions of said base wiring pattern, defining a plurality of base connection pads;

wherein a bottom of said plurality of unit packages defines a last unit package; and wherein a set of said plurality of base connection pads of said base package are each electrically connected to an associated one of said plurality of stack pads of said last unit package.

13. A stack package comprising:

a semiconductor chip having an active surface;

a double wiring substrate comprising a flexible tape having an upper surface with a first wiring pattern, a lower surface with a second wiring pattern, and an adhesive film having a first side affixed to said lower surface and a second side with at least a portion therefore affixed to an active surface of said semiconductor chips; and a plurality of bonding wires, each of said bonding wires having a first end connected to a portion of the active surface exposed by a window in the double wiring substrate and a second end connected to said first wiring pattern;

wherein a portion of said flexible tape extends around an edge of and to a bottom surface of said semiconductor chip with said adhesive film.

* * * * *